United States Patent
Jeong et al.

(10) Patent No.: US 9,015,403 B2
(45) Date of Patent: Apr. 21, 2015

(54) METHOD FOR ADJUSTING PERFORMANCE OF A STORAGE DEVICE AND A SEMICONDUCTOR STORAGE DEVICE THEREFOR

(75) Inventors: Jeonghoon Jeong, Yongin-si (KR); JiHong Kim, Seoul (KR); Sungjin Lee, Seoul (KR); Kyung Ho Kim, Seoul (KR); Sangmok Kim, Seoul (KR); Hyunchul Park, Ansan-si (KR); Otae Bae, Daegu (KR); Donggi Lee, Yongin-si (KR)

(73) Assignees: Samsung Electronics Co., Ltd., Suwon-Si, Gyeonggi-Do (KR); SNU R&DB Foundation, Seoul (KR)

( * ) Notice: Subject to any disclaimer, the term of this patent is extended or adjusted under 35 U.S.C. 154(b) by 194 days.

(21) Appl. No.: 13/534,830

(22) Filed: Jun. 27, 2012

(65) Prior Publication Data

US 2013/0111112 A1    May 2, 2013

(30) Foreign Application Priority Data

Nov. 2, 2011    (KR) ......................... 10-2011-0113217

(51) Int. Cl.
*G06F 13/00*    (2006.01)
*G11C 16/34*    (2006.01)
*G06F 13/16*    (2006.01)

(52) U.S. Cl.
CPC .......... *G11C 16/349* (2013.01); *G06F 13/1689* (2013.01)

(58) Field of Classification Search
CPC ... G06F 3/061; G06F 3/0653; G06F 12/0804; G06F 12/0871; G06F 13/1689; G06F 13/18; G06F 2212/401; G06F 2212/402

USPC ........................................... 711/100, 103, 104
See application file for complete search history.

(56) References Cited

U.S. PATENT DOCUMENTS

| | | | |
|---|---|---|---|
| 7,548,982 B2 * | 6/2009 | Gu et al. | 709/228 |
| 7,716,332 B1 * | 5/2010 | Topfl et al. | 709/226 |
| 7,809,900 B2 | 10/2010 | Danilak | |
| 7,903,486 B2 | 3/2011 | Danilak | |
| 8,504,411 B1 * | 8/2013 | Subasic et al. | 705/7.33 |
| 8,676,741 B2 * | 3/2014 | Ulinski et al. | 706/52 |

(Continued)

FOREIGN PATENT DOCUMENTS

| | | |
|---|---|---|
| KR | 1020120017830 | 2/2012 |
| KR | 1020120017831 | 2/2012 |

(Continued)

OTHER PUBLICATIONS

Lee, "Lifetime Management of Flash-Based SSDs Using Recovery-Aware Dynamic Throttling"—ISBN: ISBN 978-1-931971-08-9, pp. 61-74, Feb. 14-17, 2012.*

*Primary Examiner* — Arpan P. Savla
*Assistant Examiner* — Mohamed Gebril
(74) *Attorney, Agent, or Firm* — F. Chau & Associates, LLC (57) ABSTRACT

A method of controlling a storage device, the method including calculating, in a controller of the storage device, data throughput of the storage device in a current period, comparing, in the controller, the data throughput to a reference value and adjusting, with the controller, an operation performance of the storage device in a next period based on the comparison and a delay factor of a period prior the current period.

13 Claims, 9 Drawing Sheets

(56) References Cited

U.S. PATENT DOCUMENTS

| | | | |
|---|---|---|---|
| 2004/0128618 A1* | 7/2004 | Datta | 715/513 |
| 2008/0228992 A1 | 9/2008 | Dumitru et al. | |
| 2008/0288863 A1* | 11/2008 | Bohannon | 715/255 |
| 2009/0300277 A1 | 12/2009 | Jeddeloh | |
| 2012/0047317 A1* | 2/2012 | Yoon et al. | 711/103 |
| 2013/0086302 A1* | 4/2013 | Tressler et al. | 711/103 |

FOREIGN PATENT DOCUMENTS

| | | |
|---|---|---|
| KR | 1020120017832 | 2/2012 |
| KR | 1020120017911 | 2/2012 |

* cited by examiner

METHOD FOR ADJUSTING PERFORMANCE OF A STORAGE DEVICE AND A SEMICONDUCTOR STORAGE DEVICE THEREFOR

CROSS-REFERENCE TO RELATED APPLICATION

This U.S. non-provisional patent application claims priority under 35 U.S.C. §119 to Korean Patent Application No. 10-2011-0113217, filed on Nov. 2, 2011, the disclosure of which is incorporated by reference herein in its entirety.

BACKGROUND

1. Technical Field

The present inventive concept relates to semiconductor storage devices configured to store data in a semiconductor memory and, more particularly, to a method for adjusting the guaranteed lifetime of a storage device including a semiconductor memory and a semiconductor storage device therefor.

2. Discussion of the Related Art

Among nonvolatile memories, a flash memory collectively processes data of its memory cells. For at least this reason, flash memories are widely used in computers, solid state drives/disks (SSDs), memory cards, and so forth.

Flash memories are increasingly employed in semiconductor storage devices used by portable information devices such as mobile phones, personal digital assistants (PDAs), and digital cameras.

Due to the endurance limit of a storage device, a semiconductor storage device including the storage device has a predetermined lifetime in which normal operation is guaranteed.

However, if an excessive workload is applied to a storage device, a semiconductor storage device including the storage device may not satisfy its guaranteed lifetime. For example, when a program-erase cycle (PE-cycle) is excessively performed on one block of a flash memory (e.g., a storage device) for a certain time, the lifetime of a semiconductor storage device including the storage device may be reduced due to the endurance limit of the block. Moreover, when an excessive workload is applied to the storage device, a large number of run-time bad blocks may be unexpectedly generated. Therefore, the actual lifetime of the semiconductor storage device may be less than its guaranteed lifetime.

SUMMARY

Exemplary embodiments of the inventive concept provide a method for adjusting operation performance of a storage device and a semiconductor storage device therefor.

According to an exemplary embodiment of the inventive concept, there is provided a method of controlling a storage device, the method including: calculating, in a controller of the storage device, data throughput of the storage device in a current period; comparing, in the controller, the data throughput to a reference value; and adjusting, with the controller, an operation performance of the storage device in a next period based on the comparison and a delay factor of a period prior the current period.

The operation performance of the storage device is decreased in the next period when the data throughput is greater than the reference value.

The next period is longer than the current period.

The operation performance of the storage device is increased in the next period when the data throughput is less than the reference value.

A delay time of the storage device is decreased by a constant value.

The operation performance of the storage device corresponds to a number of program-erase cycles performed on the storage device in the next period.

The reference value is an average data throughput of the storage device.

The storage device includes a nonvolatile memory.

According to an exemplary embodiment of the inventive concept, there is provided a method of operating a controller of a storage device, the method including: receiving a command from a host; calculating data throughput of the storage device in response to the command in a current period; comparing the data throughput of the current period to average data throughput of the storage device; and outputting a delay signal to the storage device based on the comparison and a first delay factor, wherein the first delay factor is a delay factor of a period prior the current period, wherein the delay signal causes data throughput of the storage device in a next period to be changed, wherein the next period occurs after the current period.

The data throughput of the next period is changed by a constant value.

The data throughput of the next period is increased.

The data throughput of the next period is increased according to a second delay factor, wherein the second delay factor is computed by adding the first delay factor to a first value.

The first value is computed by subtracting a time at which the data throughput of the current period exceeds the average data throughput from an end time of the current period and dividing this result by the data throughput of the current period.

The data throughput of the next period is decreased.

The data throughput of the next period is decreased according to a second delay factor, wherein the second delay factor is computed by subtracting a first value from the first delay factor.

The first value is computed by subtracting a time at which the data throughput of the current period exceeds the average data throughput from an end time of the current period and dividing this result by the data throughput of the current period.

According to an exemplary embodiment of the inventive concept, there is provided a method of controlling a storage device, the method including: calculating, at a controller of the storage device, a first delay factor based on data throughput of the storage device in a current period; and adjusting, with the controller, data throughput of the storage device in a next period based on the first delay factor, wherein the first delay factor is based on a second delay factor, wherein the second delay factor is a delay factor of a period prior the current period.

The first delay factor is equal to a first value times the second delay factor plus a second value.

The first and second values are predetermined.

According to an exemplary embodiment of the inventive concept, there is provided a method of controlling a storage device, the method including: calculating, in a controller of the storage device, a delay factor based on data throughput of the storage device in a current period; and adjusting, with the controller, data throughput of the storage device in a next period based on the delay factor of the current period, wherein the delay factor of the current period is based on delay factors of periods prior the current period.

The delay factors of the periods prior the current period are weighted such that the delay factor of a prior period closest to the current period has more influence on the calculation of the delay factor of the current period than the delay factor of a prior period farther from the current period.

According to an exemplary embodiment of the inventive concept, there is provided a memory system that includes: a storage configured to store data in response to an operation command; and a controller configured to adjust the operation command in a next period based on a comparison of data throughput of the storage in a current period to a predetermined data throughput of the storage, wherein the adjustment of the operation command is further based on a first delay factor, wherein the first delay factor is a delay factor of a period prior the current period.

The controller is included in a central processing unit.

The controller includes: a period load part configured to calculate the data throughput of the storage in the current period in response to an input command; a predict delay unit configured to calculate a second delay factor based on a comparison of the calculated data throughput of the storage to the predetermined data throughput of the storage and output a delay signal based on the second delay factor; a constant delay unit configured to generate and output a constant delay signal; a delay selector configured to select one of the delay signal and the constant delay signal; and a delay adjuster configured to generate an operation performance delay control signal in response to an output of the delay selector and the input command.

The storage is a nonvolatile memory.

BRIEF DESCRIPTION OF THE DRAWINGS

The above and other features of the inventive concept will become more apparent by describing in detail exemplary embodiments thereof with reference to the accompanying drawings, in which.

DETAILED DESCRIPTION OF THE EMBODIMENTS

Hereinafter, exemplary embodiments of the inventive concept will be described in detail with reference to the accompanying drawings. The inventive concept may, however, be embodied in many different forms and should not be construed as limited to the exemplary embodiments set forth herein.

It will be understood that when an element or line is referred to as being "on," "connected to" or "coupled to" another element or line, it can be directly on, connected or coupled to the other element or line, or intervening elements or lines may be present.

As used herein, the singular forms "a," "an" and "the" are intended to include the plural forms as well, unless the context clearly indicates otherwise.

Each embodiment described and exemplified herein may include a complementary embodiment thereof. Note that flash memory devices, their basic operations and program and block erase operations will not be described in detail.

Figure 1:
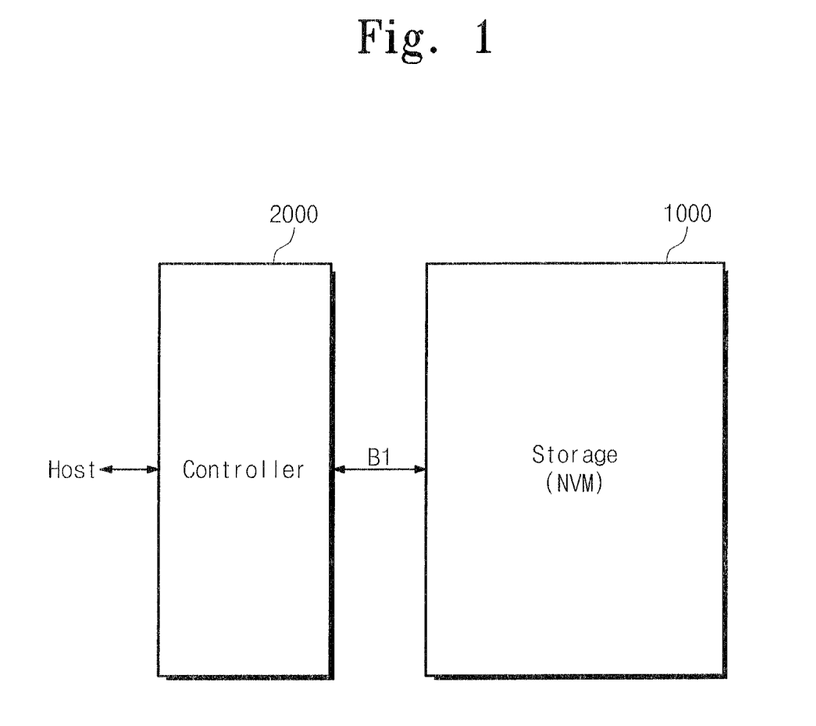
FIG. 1 is a block diagram of a semiconductor storage device according to an exemplary embodiment of the inventive concept.

FIG. 1 is a block diagram of a semiconductor storage device according to an exemplary embodiment of the inventive concept. As illustrated, the semiconductor storage device includes a storage 1000 configured to nonvolatily store data in response to an operation command and a controller 2000 configured to adjust the operation command applied in a current period based on a delay factor and a comparison of average data throughput calculated in a previous period with a predetermined average data throughput.

The controller 2000 calculates the average data throughput of the storage 1000 for the previous period when the storage 1000 operates with a workload applied in the previous period and compares the calculated data throughput with the predetermined average data throughput. The lifetime of the storage 1000 is guaranteed for a fixed time if the storage 1000 operates with the predetermined average data throughput. The controller 2000 calculates the delay factor. This will be described in detail later. The controller 2000 adjusts operation performance of the storage 1000 in the current period according to a result of the comparison and the delay factor.

To explain the above in a different way, the controller 2000 calculates average data throughput of the storage 1000 for a current period when the storage 1000 operates with a workload applied in the current period and compares the calculated average data throughput with the predetermined average data throughput. The controller 2000 calculates the delay factor. The controller 2000 determines a delay of the operation command in the next period according to a result of the comparison and the delay factor.

The storage 1000 may be used to store various types of data such as texts, graphs, and software codes. The storage 1000 may comprise various nonvolatile memories such as a NAND flash memory, a NOR flash memory, a phase change random access memory (PRAM), a ferroelectric RAM (FeRAM), and a magnetoresistive RAM (MRAM). However, it will be appreciated that nonvolatile memories applied to the storage 1000 are not limited thereto.

The controller 2000 may control the storage 1000 in response to an external request provided from a host or the like. The controller 2000 may compress externally provided data and allow the compressed data to be stored in the storage 1000. The data compression manner enables the storage 1000 to be used efficiently (e.g., to store a large amount of data at low cost). In addition, the data compression manner reduces the traffic on a bus B1 coupled between the storage 1000 and the controller 2000.

Figure 2:
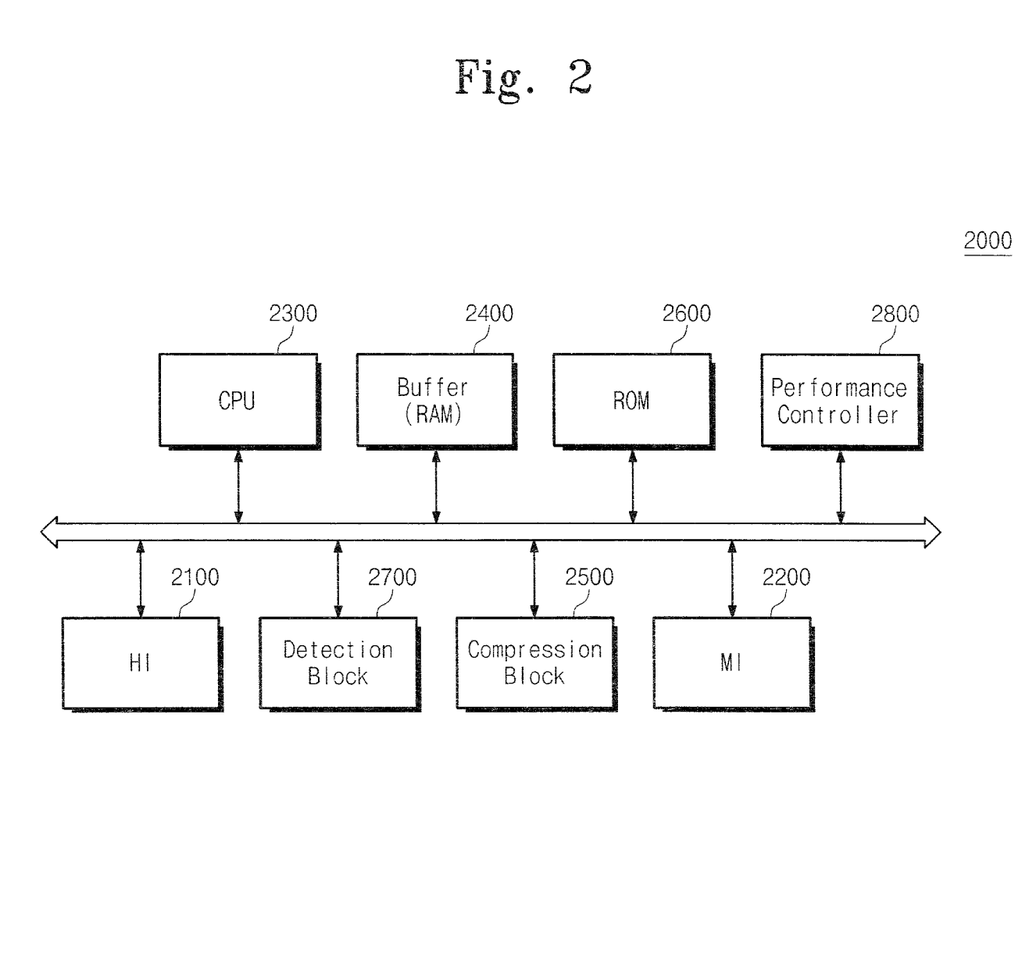
FIG. 2 is a block diagram illustrating a controller in FIG. 1, according to an exemplary embodiment of the inventive concept.

The controller 2000 may be configured as shown in FIG. 2 to adjust operation performance of the storage 1000.

FIG. 2 is a block diagram of the controller 2000 in FIG. 1, according to an exemplary embodiment of the inventive concept. As illustrated, the controller 2000 may include a first interface (HI) 2100 responsible for host interfacing, a second interface (MI) 2200 responsible for memory interfacing, a central processing unit (CPU) 2300 functioning as a processing unit, a buffer 2400 functioning as a working memory (e.g., RAM), a compression block 2500, a deviation detection block 2700, a performance controller 2800 configured to adjust operation performance according to an exemplary embodiment of the inventive concept, and a read only memory (ROM) 2600.

The first interface 2100 may be configured to interface with an external entity of the controller 2000 (or host), and the second interface 2200 may be configured to interface with the storage 1000 in FIG. 1. The processing unit, e.g., the CPU 2300 may be configured to control the operation of the controller 2000. For example, the CPU 2300 may be configured to manage firmware such as a flash translation layer (FTL) stored in the ROM 2600. The FTL may be used to manage mapping information. However, it will be understood that the role of the FTL is not limited thereto. For example, the FTL may be used to manage wear-leveling, manage a bad block, and manage data retention resulting from an unexpected power supply interruption.

The buffer 2400 may be used to temporarily store data to be externally transferred through the first interface 2100. In addition, the buffer 2400 may be used to temporarily store data to be transferred from the storage 1000 through the second interface 2200.

The compression block 2500 may be configured to compress data of the buffer 2400 in response to the control of the CPU 2300 (or the control of the FTL managed by the CPU 2300). The compressed data may be stored in the storage 1000 through the second interface 2200. Additionally, the compression block 2500 may be configured to decompress data read from the storage 1000 in response to the control of the CPU 2300 (or the control of the FTL managed by the CPU 2300). The compression function of the compression block 2500 may be selectively performed. In such a case, input data may be stored in the storage 1000 through the buffer 2400 without being compressed. For example, ON/OFF of the compression block 2500 may be done according to input data. When multimedia data that is compressed data is provided to a semiconductor storage device or the size of the provided data is so small that a relatively large amount of power is consumed to compress the data, the operation of the compression block 2500 may be turned off. The ON/OFF of the compression block 2500 may be done by hardware (e.g., a register) or software. Externally provided data may be stored directly in the storage 1000 through the first and second interfaces 2100 and 2200 without bypassing the buffer 2400.

In FIG. 2, the performance controller 2800 is connected to the CPU 2300 through a bus. The performance controller 2800 calculates average data throughput of the storage 1000 in a current period when the storage 1000 operates with a workload applied in the current period and compares the calculated average data throughput with a predetermined average data throughput. The performance controller 2800 calculates a delay factor. The performance controller 2800 delays the operation command such that the operation performance of the storage 1000 is adjusted in the next period according to a result of the comparison and the delay factor.

In FIG. 2, the function of the performance controller 2800 may be additionally merged with the function of the CPU 2300. The performance controller 2800 will be described in detail later with reference to FIG. 4.

Figure 3:
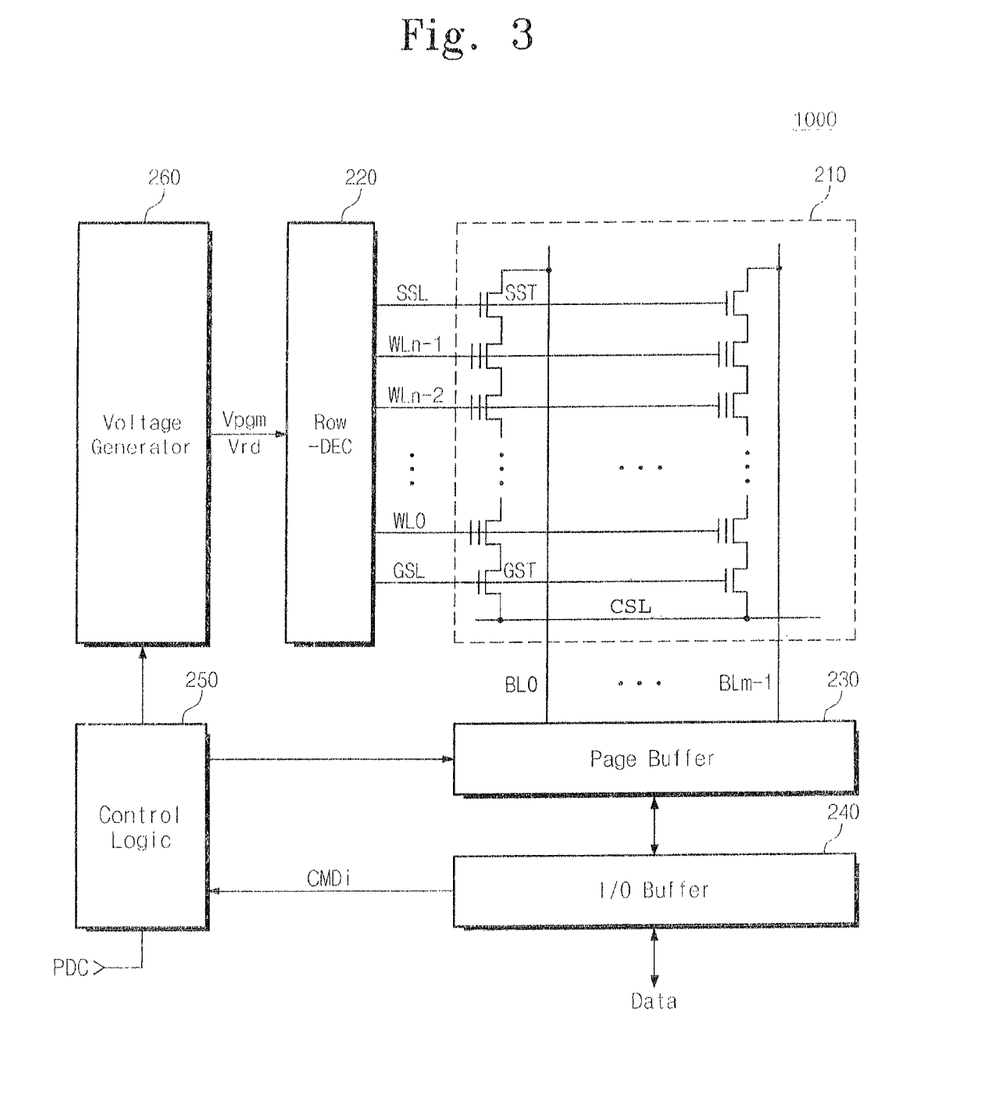
FIG. 3 is a block diagram illustrating a storage in FIG. 1, according to an exemplary embodiment of the inventive concept.

FIG. 3 is a block diagram illustrating the storage 1000 in FIG. 1, according to an exemplary embodiment of the inventive concept. Referring to FIG. 3, there is shown an example in which the storage 1000 comprises a NAND-type flash memory among various types of nonvolatile memories (NVM).

The flash memory includes a memory cell array 210, a row decoder 220, a page buffer 230, an input/output (I/O) buffer 240, a control logic 250, and a voltage generator 260.

The memory cell array 210 includes a plurality of memory cells connected to bitlines BL0-BLm−1 and wordlines WL0-WLn−1. The memory cell array 210 includes a plurality of NAND cell strings where channels of memory cell transistors are serially connected to each other between a string selection transistor SST and a ground selection transistor GST. The string selection transistor SST is connected to a string selection line SSL, the ground selection transistor GST is connected to a ground selection line GSL and a common source line CSL.

In general, the row decoder 220 selects a wordline in response to a row address. The row decoder 220 transfers various wordline voltages (Vpgm, Vrd, etc.) supplied from the voltage generator 260 to selected wordlines. During a program operation, the row decoder 220 transfers a program voltage Vpgm (e.g., about 15 to 20 volts) and a verify voltage Vfy to a selected wordline and transfers a pass voltage Vpass to an unselected wordline. During a read operation, the row decoder 220 transfers a read voltage Vrd supplied from the voltage generator 260 to a selected wordline and transfers a read voltage (e.g., about 5 volts) to an unselected wordline.

The page buffer 230 serves as a write driver or a sense amplifier according to an operation mode. For example, the page buffer 230 serves as a sense amplifier in a read operation mode and serves as a write driver in a program operation mode. The page buffer 230 may load one page unit of data during a program operation. In other words, the page buffer 230 may receive data to be programmed through the I/O buffer 240 and store the received data in an internal latch. The page buffer 230 supplies a ground voltage (e.g., 0 volt) to bitlines of programmed memory cells during a write (program) operation of the loaded data. The page buffer 230 supplies a precharge voltage (e.g., Vcc) to bitlines of program-inhibited memory cells.

The I/O buffer 240 temporarily stores an address or write data input through an input/output (I/O) pin. The I/O buffer 240 transfers the stored address to an address buffer (not shown), transfers program data to the page buffer 230, and transfers a command to a command register (not shown). During a read operation, read data supplied from the page buffer 230 is output to an external entity through the I/O buffer 240.

During, the program operation, the control logic 250 controls the page buffer 230 and the voltage generator 260 to receive a command CMDi from the controller 2000 through the I/O buffer 240 and write the program data into a selected memory cell. Additionally, the control logic 250 controls the page buffer 230 and the voltage generator 260 to read data in a selected cell region in response to the command of the controller 2000.

To accomplish an exemplary embodiment of the inventive concept, the control logic 250 may receive an operation performance delay control signal PDC from the controller 2000 directly or through the I/O buffer 240.

Figure 4:
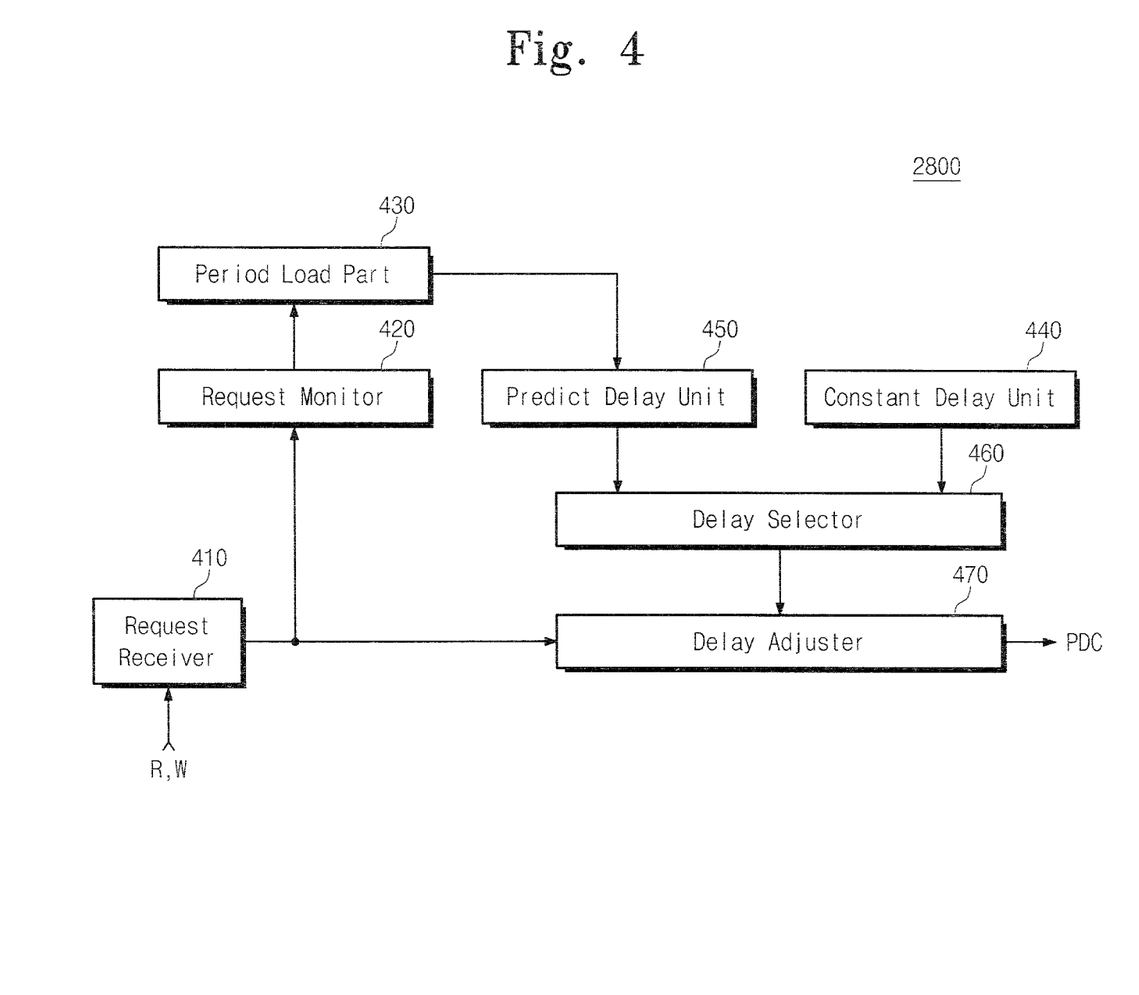
FIG. 4 is a block diagram of a performance controller in FIG. 2, according to an exemplary embodiment of the inventive concept.

The operation performance delay control signal PDC may be generated by a performance controller, as shown in FIG. 4.

FIG. 4 is a block diagram of the performance controller 2800 in FIG. 2, according to an exemplary embodiment of the inventive concept. As illustrated, the performance controller 2800 includes a request receiver 410, a request monitor 420, a period load part 430, a predict delay unit 450, a constant delay unit 440, a delay selector 460, and a delay adjuster 470. The request receiver 410 may be a read/write processor. The request monitor 420 may be a data-related read/write measuring monitor. The period load part 430 may be a data measuring instrument. The constant delay unit 440 may include a table of constant delay times, e.g., MIN/MAX delay times. The delay selector 460 may be a multiplexer.

A request (or command) for a read (R), write (W) or ease operation is applied to the request monitor 420 and the delay adjuster 470 through the request receiver 410. The delay adjuster 470 generates the operation performance delay control signal PDC in response to a delay selection output of the delay selector 460.

The delay selector 460 may select either one of a delay output of the predict delay unit 450 and a delay output of the constant delay unit 440 to be applied as the delay selection output to the delay adjuster 470.

The period load part 430 calculates periodic average data throughput of the storage 1000. For example, the period load part 430 calculates the number of processed reads/writes in a period.

The predict delay unit 450 may compare the calculated average data throughput of the storage 1000 for a current period and the predetermined average data throughput. Based on this comparison, the predict delay unit 450 may calculate the delay factor. The delay factor will be used to delay an operation command of the storage 1000 in a next period if the delay output of the predict delay unit 450 is selected by the delay selector 460.

The request monitor 420 receives the request (or command) when the request (or command) is received by the request receiver 410.

Figure 5:
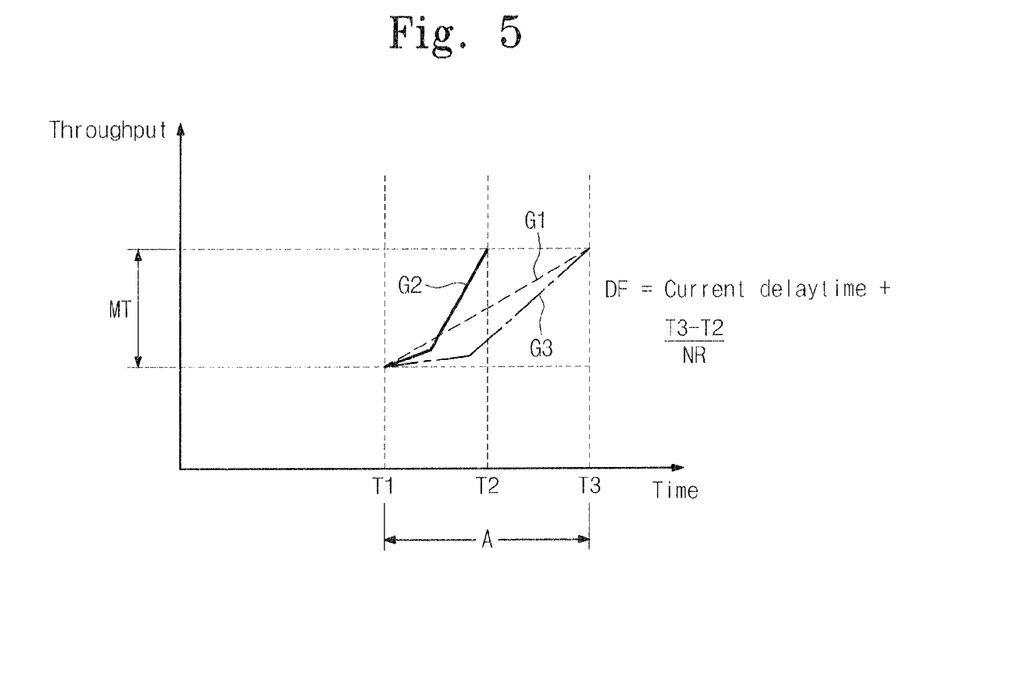
FIG. 5 illustrates a calculation of a periodical delay factor which is performed by the performance controller in FIG. 4, according to an exemplary embodiment of the inventive concept.

If the workload, which may be referred to as a program-erase (PE) cycle count, exceeds the predetermined average data throughput when the storage 1000 is employed in a server system, throughput of data to be processed may increase abruptly, as shown in FIG. 5.

FIG. 5 illustrates a calculation of a periodical delay factor which is performed by the performance controller 2800 in FIG. 4, according to an exemplary embodiment of the inventive concept.

In the graph in FIG. 5, a horizontal axis represents time and a vertical axis represents throughput. A period "A" represents any one period. For the one period, tens to millions of PE cycles may be performed. The period A may be a minute, a day or a week, for example. A graph G1 indicated by dashed lines shows a predetermined average data processing rate for one period. In other words, data is to be processed according to the processing rate shown in the graph G1 if the lifetime of the storage 1000 is to be met. However, when the average data throughput is set to have a maximum throughput MT for the period A, a processing ratio may appear as shown in a graph G2 when a workload is excessive in one period. In such a case, the pre-set average data throughput for the period A is exhausted at adjustment turning time point T2 not at end time point T3. As a result, since the guaranteed lifetime of the storage 1000 may be reduced when a workload occurs as depicted by the graph G2, the average data processing rate is to be adjusted as depicted by a graph G3 in the next period. To achieve this, a delay factor DF for adjusting the delay amount of an operation command is obtained as follows: DF=current delay time+((T3−T2)/NR) (NR being the number of requests made from a start time point T1 to the adjustment turning time point T2). Current delay time being a previous period's delay factor. For example, the delay factor of a period prior the period A.

For example, if a value of the adjustment turning time point T2 is 70, a value of the end time point T3 is 100, and a value of the throughput MT is 10, the delay factor DF is obtained as follows: DF=current delay time+((100−70)/10). Accordingly, the obtained delay factor DF is used to increase the delay amount of the operation command in the next period.

In the case of FIG. 5, a delay factor is obtained by dividing a result of subtracting a value of an adjustment turning time point from a value of an end time point in one cycle by the number of operation requests applied to the adjustment turning time point and adding the division result to the current delay time. When the calculated average data throughput is greater than the predetermined average data throughput, the operation performance of the storage 1000 goes down in the next period based on the delay factor. The delay factor may be obtained by other methods.

For example, when the average data throughput calculated for one period is less than the predetermined average data throughput, the operation performance of the storage 1000 goes up in the next period based on the delay factor. In this case, the delay factor is computed as follows DF=current delay time−((T3−T2)/NR).

The delay factor of a current period can also be computed as follows. Delay $(x)=\alpha*$Delay factor $(x-1)+\beta$. In this case, period x: $0<x<N$ and $\alpha$ and $\beta$ are predetermined values which help the delay time find the best value.

When the storage 1000 includes a NAND flash memory as a main data storage element, the predetermined average data throughput may vary with the type of memory cell.

A memory cell array of a NAND flash memory is divided into blocks each including a plurality of pages. During utilization of the NAND flash memory, an erase operation is performed in a unit of blocks and a program (write) operation is performed in a unit of pages. A block in which all pages are programmed is re-erased to be programmed with new data.

The above series of operations are referred to as a PE-cycle. In the case of a NAND flash memory, there is a limitation in the number of PE-cycles that one block can endure; this is called the endurance of the NAND flash memory. As an example, 100,000 PE-cycles are guaranteed in a single-level cell (SLC) type NAND flash memory and 3,000 to 5,000 PE-cycles are guaranteed in a multi-level cell (MLC) type NAND flash memory.

When the number of PE-cycles performed by one block exceeds the endurance limit, a probability that the block will malfunction increases. Therefore, for data integrity of a semiconductor storage device, the block may not be used anymore. As a result, a semiconductor storage device employing a flash memory is limited in lifetime.

Another reason for limitation in lifetime is the existence of the number of bad blocks. A block in a NAND flash memory may suffer from a malfunction caused by program failure or erase failure.

In this case, the block is regarded as a run-time bad block and replaced with another block previously reserved.

Besides a run-time bad block, there is an initial bad block that is already known as a bad block when a NAND flash memory is shipped from a factory.

Generally, a small number of run-time bad blocks are generated over a long period of time when a NAND flash memory is used. In addition, a small number of initial bad blocks normally exist when the NAND flash memory is shipped from a factory.

However, if a large number of run-time bad blocks are generated in a short period of time or a large number of initial bad blocks exist in the early stage, all reserved blocks may be exhausted. Therefore, a semiconductor storage device cannot be used any longer. For this reason as well, the lifetime of the semiconductor storage device is limited.

When an excessive workload is applied to the semiconductor storage device, the lifetime of the semiconductor storage device may fall below its guaranteed lifetime. In particular, a solid state disk/drive (SSD) comprising an MLC NAND flash memory which takes aim at a server application, may not meet is guaranteed lifetime. In a server-oriented semiconductor storage device, high performance, e.g., high input/output (I/O) per second is required and the amount of an applied workload is relatively small.

If an MLC NAND flash memory having a relatively low endurance limit is applied to such applications, the lifetime guarantee of the SSD may not be reliable. Moreover, if a large number of run-time bad blocks are generated for a short period of time due to an excessive workload of the SSD, the guaranteed lifetime may be unexpectedly shortened.

In an exemplary embodiment of the inventive concept, the performance controller 2800 for delaying an operation command in the current period is provided to adjust the operation performance of the storage 1000 according to change in workload. Thus, the lifetime of the storage 1000 or a semiconductor storage device including the storage 1000 may be guaranteed or increased.

The operation performance of the storage 1000 is adjusted by regulating the delay amount of an operation command applied to the storage 1000.

The adjustment of the operation performance of the storage 1000 may be done within a range that does not exceed the maximum reference data throughput per unit time even when the workload is changed. The maximum reference data throughput is predetermined. For example, under the condition that a minimum guaranteed lifetime is three years and a maximum processing speed of a processable write command is 100 MB/sec, the controller 2000 delays the processing of the command to limit the data processing speed within 100 MB/sec.

Alternatively, the adjustment of the operation performance of the storage 1000 may be done within a range that does not exceed reference data throughput for lifetime guarantee even when the workload is changed. Assuming that data is processed at a constant rate per time to guarantee the lifetime of the storage 1000, the accumulated amount of data may be defined as the reference data throughput for lifetime guarantee. The reference data throughput for lifetime guarantee increases regularly with the lapse of time. Thus, the controller 2000 adjusts the operation performance of the storage 1000 so as not to exceed the reference data throughput for lifetime guarantee.

Furthermore, a weight may be applied in calculating how the operation performance of the storage 1000 is adjusted. The weight may be different for each cycle in progress. In other words, when a weight that is different for each cycle is applied, its influence on the delay amount may be different for each cycle. Various methods may be used to distribute the weight.

For example, the average data throughput may be given as follows:

$$\{C(1)+C(2)+ \ldots +C(n)\}/n;$$

wherein $C(x)$ represents average data throughput of the xth previous period from the current period, and n is a positive integer.

if the PE cycle count goes above a predetermined reference value or is changed to go above a predetermined reference deviation value to adaptively cope with an exceptional case, the one-cycle time may increase such that the PE cycle count is equal to average data throughput of a plurality of periods. In this case, the lifetime guarantee may not be obtained by adjusting the delayed time for each period, but rather, by adjusting the delay time over many cycles.

Figure 6:
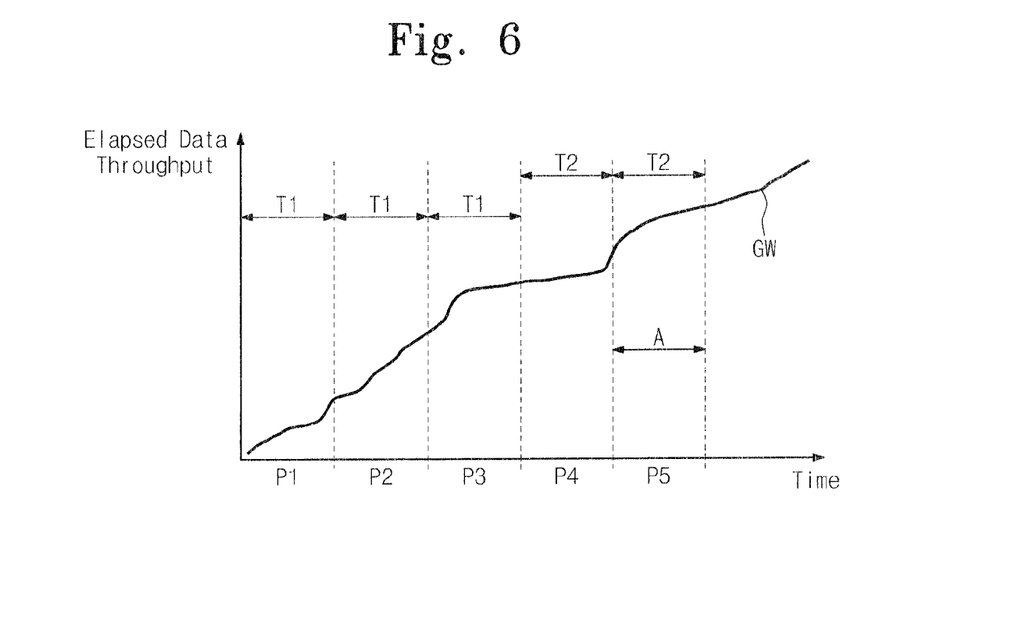
FIG. 6 illustrates a change in data throughput depending on application of the delay factor in FIG. 5, according to an exemplary embodiment of the inventive concept.

FIG. 6 illustrates a change in data throughput depending on application of the delay factor in FIG. 5, according to an exemplary embodiment of the inventive concept. In the graph in FIG. 6, a horizontal axis represents time and a vertical axis represents accumulated throughput.

As described with reference to FIG. 5, a result of processing data over time by determining the delay amount of the next period after obtaining a delay factor of the current period is shown as GW in the graph of FIG. 6. In FIG. 5, a period A may correspond to one of P1, P2, P3, P4, and P5 in FIG. 6.

The following table illustrates the delay factor and delay times corresponding to P1-P5 in FIG. 6.

|  | Classification | | | | |
| --- | --- | --- | --- | --- | --- |
|  | P1 | P2 | P3 | P4 | P5 |
| Delay Factor | DF(P1) | DF(P2) | DF(P3) | DF(P4) | DF(P5) |
| Delay Time | T1 | T1 | T1 | T2 | T2 |

For example, an un-weighted T2 delay={DF(P1)+DF(P2)+DF(P3)}/3. A weighted T2 delay=W1*DF(P1)+W2*DF(P2)+W3*DF(P3). W(x) represents a weight of an xth previous period from the current period. W1 is least weighted, whereas W3 is most weighted. In other words, a current period's delay factor is more important than a prior period's delay factor.

As described above, if operation performance of the storage 1000 is adjusted through comparison between average data throughput calculated for one period and the predetermined average data throughput, the lifetime of the storage 1000 or a semiconductor storage device including the storage 1000 is guaranteed or increased.

Figure 7:
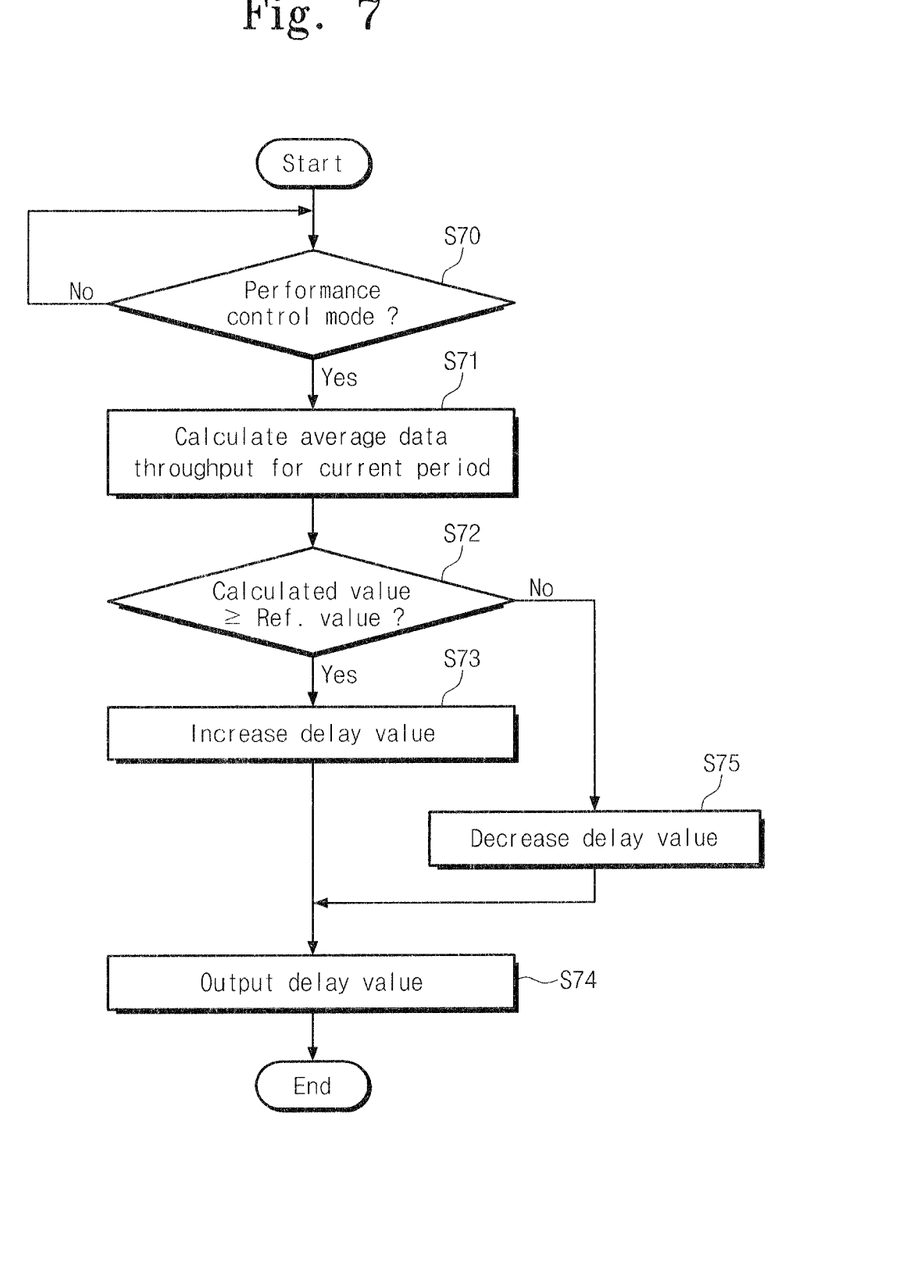
FIG. 7 is a flowchart illustrating a method of adjusting performance of a semiconductor storage device according to an exemplary embodiment of the inventive concept.

FIG. 7 is a flowchart illustrating a method of adjusting performance of a semiconductor storage device according to an exemplary embodiment of the inventive concept.

At step S70, the performance controller 2800 in FIG. 2 checks whether the current mode is a performance control mode. If the current mode is not the performance control mode, the delay selector 460 may select an output of the constant delay unit 440. In this case, operation performance adjustment for lifetime guarantee is constantly performed irrespective of a change in workload. In other words, a preset delay time is constantly provided to the delay selector 460. If the current mode is the performance control mode at step S70, the flow proceeds to step S71.

At step S71, average data throughput is calculated for the current period, which is performed by the period load part 430, as described above.

At step S72, the calculated average data throughput is compared with a predetermined average data throughput (Ref. value), which is known to guarantee the lifetime of the storage 1000 for a predetermined period of time.

If a result of the comparison is that the calculated average data throughput is greater than the predetermined average data throughput, the flow proceeds to step S73 in which a delay value for delaying an operation command increases to allow the operation performance of the storage 1000 to go down in the next period.

If a result of the comparison is that the calculated average data throughput is smaller than the predetermined average data throughput, the flow proceeds to step S75 in which a delay value for delaying an operation command decreases to allow the operation performance of the storage 1000 to go up in the next period.

At step S74, the delay value is output.

As described above, if the delay time is adjusted to suitably limit the operation performance of the storage 1000, reliability of the lifetime guarantee of the storage 1000 is enhanced.

Figure 8:
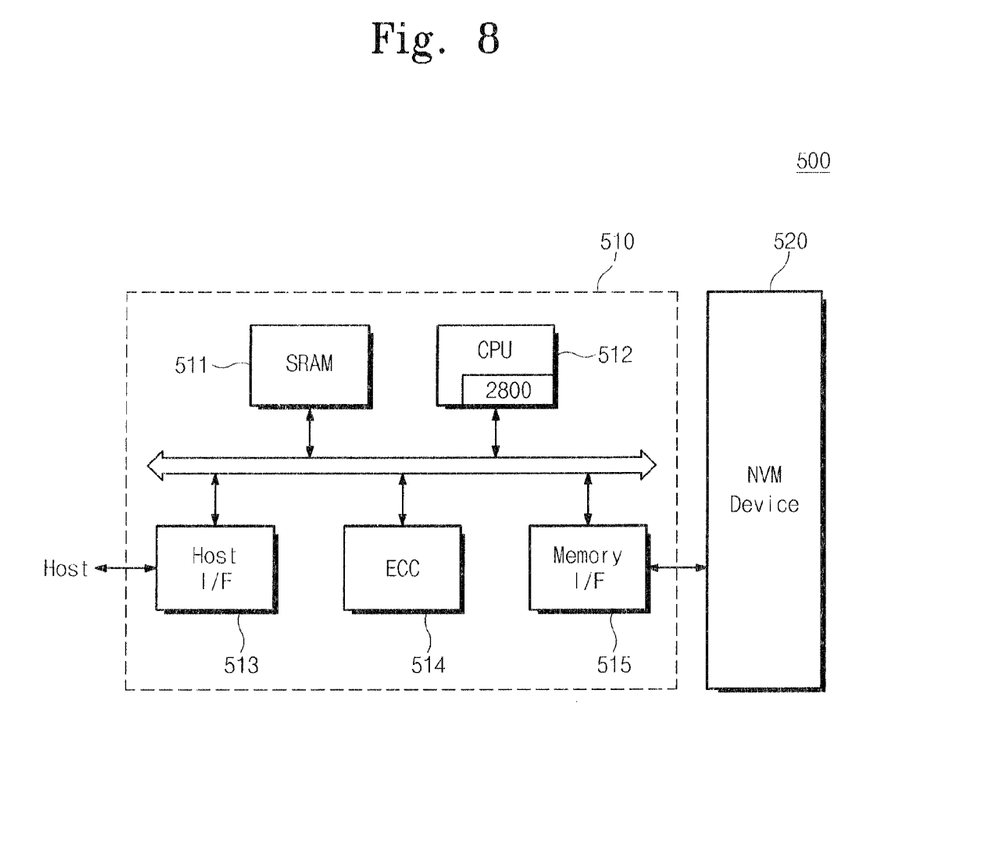
FIG. 8 is a block diagram illustrating an exemplary embodiment of the inventive concept applied to a data processing system.

FIG. 8 is a block diagram illustrating an exemplary embodiment of the inventive concept applied to a data processing system 500. As illustrated, the data processing system 500 includes a nonvolatile memory device 520 and a memory controller 510.

The nonvolatile memory device 520 may be implemented with a flash memory, as described with reference to FIG. 3. The memory controller 510 controls the nonvolatile memory device 520 through a memory interface 515. A memory card or an SSD may be provided by a combination of the nonvolatile memory device 520 and the memory controller 510. In other words, the data processing system 500 may be an SSD.

A static random access memory (SRAM) 511 in the memory controller 510 is used as a working memory of a CPU 512. A host interface 513 is in charge of interfacing between the data processing system 500 and a host and may include a data exchange protocol.

An error correction block (ECC) 514 detects and corrects an error which may be included in data read from the nonvolatile memory device 520.

The memory interface 515 is in charge of interfacing between the memory controller 510 and the nonvolatile memory device 520.

The CPU 512 performs the control operations for data exchange of the memory controller 510. Although not shown in FIG. 8, it is apparent to those skilled in the art that the memory controller 510 according to an exemplary embodiment of the inventive concept may further include a ROM or a nonvolatile RAM configured to store code data for interfacing with the host.

The CPU 512 includes the performance controller 2800 shown in FIG. 2 such that the operation performance of the nonvolatile memory device 520 may be adjusted according to change in workload. Thus, the lifetime of the data processing system 500 is guaranteed or increased.

The nonvolatile memory device 520 may be provided as a multi-chip package comprising a plurality of flash memory chips.

The data processing system 500 may extend the lifetime of the nonvolatile memory device 520 and function as a high-reliability storage medium with a low error probability.

The memory controller 510 may be configured to communicate with an external entity (e.g., host) through one of various interface protocols such as universal serial bus (USB), multimedia card (MMC), peripheral component interconnect express (PCI-E), serial advanced technology attachment (SATA), parallel advanced technology attachment (PATA), small computer system interface (SCSI), enhanced small disk interface (ESDI), and integrated drive electronics (IDE).

Figure 9:
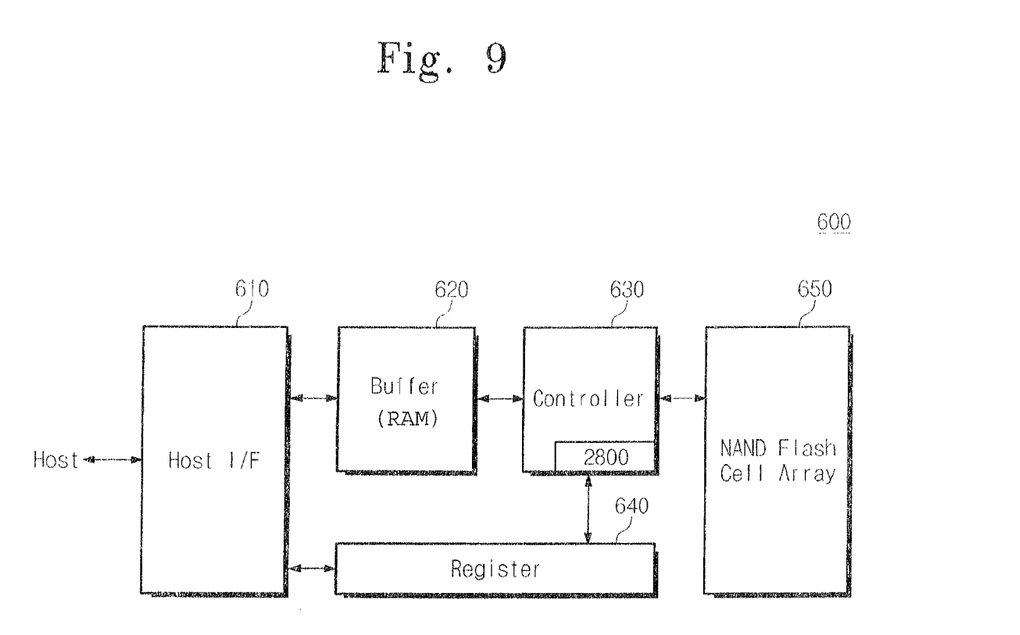
FIG. 9 is a block diagram illustrating an exemplary embodiment of the inventive concept applied to a fusion memory system.

FIG. 9 is a block diagram illustrating an exemplary embodiment of the inventive concept applied to a fusion memory system.

A OneNAND flash memory device 600 may be employed as a fusion memory device or a fusion memory system.

The OneNAND flash memory device 600 includes a host interface 610, a buffer (RAM) 620, a controller 630, a register 640, and a NAND flash cell array 650. The host interface 610 may exchange all sorts of information with devices by a variety of different protocols. The buffer 620 includes a built-in code for driving a memory device or temporarily stores data. The controller 630 controls reading, programming and other operations in response to a control signal and a command that are provided externally. The register 640 stores commands, addresses, and data such as configuration data defining a system operation environment in the OneNAND flash memory device 600. The NAND flash cell array 650 includes a nonvolatile memory cell and a page buffer.

The controller 630 includes the performance controller 2800 as described in FIG. 2 such that operation performance of the NAND flash cell array 650 may be adjusted according to a change in workload. Thus, the lifetime of the OneNAND flash memory device 600 is guaranteed or increased.

When there is a request from a host, the OneNAND flash memory device 600 performs operation performance adjustment according to an exemplary embodiment of the inventive concept.

As set forth above, a fusion memory system as shown in FIG. 9 delays an operation command to achieve lifetime guarantee. The delay of the operation command is dependent upon a delay factor and a comparison of average data throughput calculated in a previous period with a predetermined average data throughput.

Figure 10:
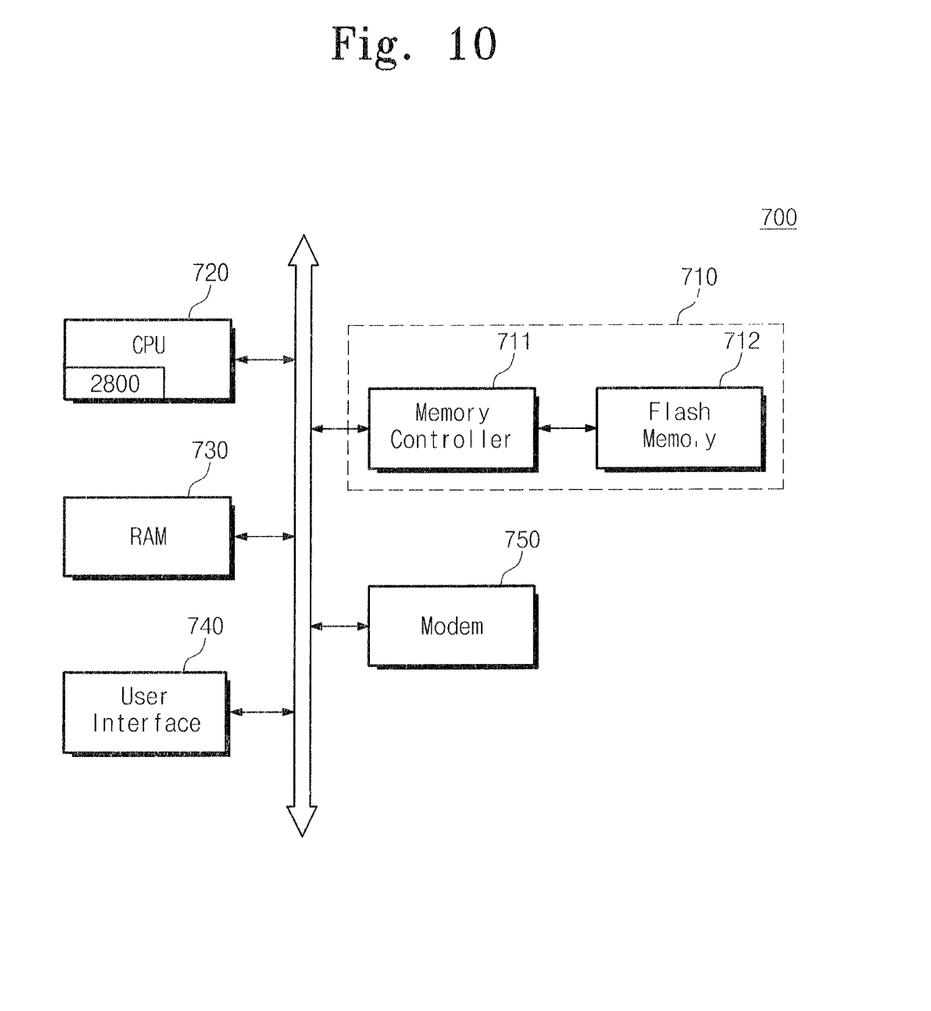
FIG. 10 is a block diagram illustrating an exemplary embodiment of the inventive concept applied to a computing system.

FIG. 10 is a block diagram illustrating an exemplary embodiment of the inventive concept applied to a computing system 700. As illustrated, the computing system 700 includes a CPU 720, a RAM 730, a user interface 740, a modem 750 such as a baseband chipset, and a memory system 710, which are electrically connected to a system bus. The memory system 710 includes a memory controller 711 and a flash memory 712.

When the computing system 700 is a mobile device, the computing system 700 may further include a battery (not shown) for supplying its own operation voltage.

In the case of a mobile device, the CPU 720 may be mounted as a dual type processor for a dual processing operation. In such a case, the RAM 730 for each processor avoids being correspondingly mounted. Accordingly, the RAM 730 may internally have a dual port and a shared memory area to be shared by the processors.

In FIG. 10, the CPU 720 may include the performance controller 2800 as described in FIG. 2. The CPU 7200 allows operation performance of the flash memory 712 to be adjusted according to a change in workload. Thus, the lifetime of the computing system 700 is guaranteed or increased.

Although not shown, it is apparent to those skilled in the art that the computing system 700 may further include an application chipset, a camera image processor (OP), and a mobile DRAM. The memory system 710, for example, may be configured as an SSD that uses a nonvolatile memory to store data. Alternatively, the memory system 710 may be implemented with a fusion flash memory (e.g., a OneNAND flash memory).

The flash memory 712, the memory controller 711 or the CPU 720 may be mounted with various types of packages. For example, the flash memory 712, the memory controller 711 or the CPU 720 may be mounted with packages such as Package on Package (PoP), Ball Grid Arrays (BGAs), Chip Scale Packages (CSPs), Plastic Leaded Chip Carrier (PLCC), Plastic Dual In-Line Package (PDIP), Die In Waffle Pack (DIWP), Die In Wafer Form (DIWF), Chip On Board (COB), Ceramic Dual In-Line Package (CERDIP), Plastic Metric Quad Flat Pack (MQFP), Thin Quad Flat Pack (TQFP), Small Outline Package (SOP), Shrink Small Outline Package (SSOP), Thin Small Outline Package (TSOP), Thin Quad Flat Pack (TQFP), System In Package (SIP), Multi Chip Package (MCP), Wafer Level Stack Package (WLSP), Die On Waffle Package (DOWP), Wafer-level Fabricated Package (WFP) and Wafer-Level Processed Stack Package (WSP).

According to an exemplary embodiment of the inventive concept, operation performance of a storage is adjusted according to a change in workload. Thus, the lifetime of the storage or a semiconductor storage device including the storage is guaranteed or increased.

While the inventive concept has been particularly shown and described with reference to exemplary embodiments thereof, it will be apparent to those of ordinary skill in the art that various changes in form and detail may be made therein without departing from the spirit and scope of the inventive concept as defined by the following claims.

What is claimed is:

1. A method of controlling a storage device, comprising:
   calculating, in a controller of the storage device, data throughput of the storage device in a current period;
   comparing, in the controller, the data throughput to a reference value; and
   adjusting, with the controller, an operation performance of the storage device in a next period based on the comparison and a delay factor of the current period,
   wherein the delay factor of the current period is computed in the current period by adding a value to a delay factor of a period prior the current period, the value being determined by subtracting a turning time where data throughput of the storage device in the current period exceeds the reference value from an end time of the current period and dividing this number by a number of requests made from a start time of the current period to the turning time of the current period.

2. The method of claim 1, wherein the operation performance of the storage device is decreased in the next period when the data throughput is greater than the reference value.

3. The method of claim 2, wherein the next period is longer than the current period.

4. The method of claim 1, wherein the operation performance of the storage device corresponds to a number of program-erase cycles performed on the storage device in the next period.

5. The method of claim 1, wherein the reference value is an average data throughput of the storage device.

6. The method of claim 1, wherein the storage device includes a nonvolatile memory.

7. A method of operating a controller of a storage device, comprising:
   receiving a command from a host;
   calculating data throughput of the storage device in response to the command in a current period;
   comparing the data throughput of the current period to average data throughput of the storage device; and
   outputting a delay signal to the storage device based on the comparison and a first delay factor, wherein the first delay factor is a delay factor of a period prior the current period,
   wherein the delay signal causes data throughput of the storage device in a next period to be changed, wherein the next period occurs after the current period and the delay signal includes a second delay factor,
   wherein the second delay factor is computed in the current period by adding a value to the first delay factor, the value being determined by subtracting a turning time where data throughput of the storage device in the current period exceeds the average data throughput from an end time of the current period and dividing this number by a number of requests made from a start time of the current period to the turning time of the current period.

8. The method of claim 7, wherein the data throughput of the next period is changed by a constant value.

9. The method of claim 7, wherein the data throughput of the next period is increased.

10. A memory system, comprising:
    a storage configured to store data in response to an operation command; and
    a controller configured to adjust the operation command in a next period based on a comparison of data throughput of the storage in a current period to a predetermined data throughput of the storage,
    wherein the adjustment of the operation command is further based on a first delay factor and a second delay factor, wherein the first delay factor is a delay factor of a period prior the current period and the second delay factor is a delay factor of the current period,
    wherein the second delay factor is computed in the current period by adding a value to the first delay factor, the value being determined by subtracting a turning time where data throughput of the storage device in the current period exceeds the predetermined data throughput from an end time of the current period and dividing this number by a number of requests made from a start time of the current period to the turning time of the current period.

11. The system of claim 10, wherein the controller is included in a central processing unit.

12. The system of claim 10, wherein the controller includes:
    a period load part configured to calculate the data throughput of the storage in the current period in response to an input command;
    a predict delay unit configured to calculate the second delay factor based on a comparison of the calculated data throughput of the storage to the predetermined data throughput of the storage and output a delay signal based on the second delay factor;
    a constant delay unit configured to generate and output a constant delay signal;
    a delay selector configured to select one of the delay signal and the constant delay signal; and
    a delay adjuster configured to generate an operation performance delay control signal in response to an output of the delay selector and the input command.

13. The system of claim 10, wherein the storage is a nonvolatile memory.

* * * * *